United States Patent
Lee et al.

(10) Patent No.: US 11,994,562 B2
(45) Date of Patent: May 28, 2024

(54) ELECTRONIC DEVICE AND METHOD FOR DIAGNOSING BATTERY THEREOF

(71) Applicant: Samsung Electronics Co., Ltd., Suwon-si (KR)

(72) Inventors: Sengtai Lee, Suwon-si (KR); Daejin Kwak, Suwon-si (KR); Jisu Ryu, Suwon-si (KR); Yonghyun Park, Suwon-si (KR); Jinhyuk Choi, Suwon-si (KR); Yonghwan Hyun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 428 days.

(21) Appl. No.: 17/309,295

(22) PCT Filed: Nov. 18, 2019

(86) PCT No.: PCT/KR2019/015764
§ 371 (c)(1),
(2) Date: May 17, 2021

(87) PCT Pub. No.: WO2020/105988
PCT Pub. Date: May 28, 2020

(65) Prior Publication Data

US 2022/0026494 A1     Jan. 27, 2022

(30) Foreign Application Priority Data

Nov. 19, 2018   (KR) ........................ 10-2018-0142607

(51) Int. Cl.
*G01R 31/3835*     (2019.01)
*G01R 31/392*     (2019.01)
(Continued)

(52) U.S. Cl.
CPC ....... *G01R 31/3835* (2019.01); *G01R 31/392* (2019.01); *H02J 7/0029* (2013.01); *H02J 7/0049* (2020.01); *G01R 31/3646* (2019.01)

(58) Field of Classification Search
CPC .............. G01R 31/3835; G01R 31/392; G01R 31/3646; G01R 31/382; G01R 31/3648;
(Continued)

(56) References Cited

U.S. PATENT DOCUMENTS 9,097,774 B2    8/2015   White et al.
11,394,217 B2 *   7/2022   Kim ........................ H02H 7/18
(Continued)

FOREIGN PATENT DOCUMENTS

JP    2001-102097 A    4/2001
JP    2007-047127 A    2/2007
(Continued)

OTHER PUBLICATIONS

International Search Report and Written Opinion of the International Searching Authority in connection with International Application No. PCT/KR2019/015764 dated Mar. 4, 2020, 9 pages.
(Continued)

*Primary Examiner* — Nha T Nguyen

(57) ABSTRACT

Various embodiments of the present invention relate to an electronic device for diagnosing a battery, and the electronic device may include a battery; and a power management module operatively connected with the battery, and including a charging circuit which controls charge of the battery, wherein the power management module is configured to monitor a charge state of the battery, if the battery reaches a first designated state, identify a time taken to change from the first designated state to a second designated state, and
(Continued)

determine whether the battery is abnormal, based at least in part on the identified time. Other various embodiments are possible.

18 Claims, 12 Drawing Sheets

(51) Int. Cl.
*H02J 7/00* (2006.01)
*G01R 31/36* (2020.01)

(58) Field of Classification Search
CPC ...... H02J 7/0049; H02J 7/0029; H02J 7/0069; H02J 7/005; H02J 7/00714; Y02E 60/10; H01M 10/44; H01M 10/48; H01M 2010/4271; H01M 10/425
USPC ......................................................... 320/149
See application file for complete search history.

(56) References Cited

U.S. PATENT DOCUMENTS

| | | | |
|---|---|---|---|
| 2013/0241496 A1* | 9/2013 | Kurayama | H02J 7/00302 320/128 |
| 2014/0184233 A1 | 7/2014 | Nam | |
| 2015/0311736 A1 | 10/2015 | Park et al. | |
| 2018/0254640 A1* | 9/2018 | Jung | H02J 7/16 |
| 2018/0261824 A1* | 9/2018 | Ju | H01M 10/48 |
| 2018/0262027 A1* | 9/2018 | Jung | H02J 7/00309 |
| 2019/0348721 A1* | 11/2019 | Unno | H02J 7/0014 |
| 2019/0379216 A1 | 12/2019 | Yoon et al. | |
| 2020/0185784 A1* | 6/2020 | Yeom | H01M 10/44 |
| 2020/0220371 A1* | 7/2020 | Lim | H02J 7/00718 |
| 2020/0271731 A1* | 8/2020 | Sugaya | H01M 10/425 |

FOREIGN PATENT DOCUMENTS

| | | |
|---|---|---|
| KR | 10-2015-0124233 A | 11/2015 |
| KR | 10-2016-0076825 A | 7/2016 |
| KR | 10-1865972 B1 | 6/2018 |
| KR | 10-2018-0073270 A | 7/2018 |
| KR | 10-2018-0101930 A | 9/2018 |

OTHER PUBLICATIONS

Korean Intellectual Property Office, "Notice of Preliminary Rejection," dated Dec. 14, 2022, in connection with Korean Patent Application No. 10-2018-0142607, 8 pages.

Korean Intellectual Property Office, "Office Action," dated Jun. 15, 2023, in connection with Korean Patent Application No. 10-2018-0142607, 8 pages.

* cited by examiner

[NORMAL STATE]

[ABNORMAL STATE]

ELECTRONIC DEVICE AND METHOD FOR DIAGNOSING BATTERY THEREOF

CROSS-REFERENCE TO RELATED APPLICATIONS

This application is a 371 of International Application No. PCT/KR2019/015764, filed Nov. 18, 2019, which claims priority to Korean Patent Application No. 10-2018-0142607, filed Nov. 19, 2018, the disclosures of which are herein incorporated by reference in their entirety.

BACKGROUND

1. Field

Various embodiments of the present invention relate to an electronic device and a method for diagnosing whether its battery is abnormal.

2. Description of Related Art

Electronic devices (e.g., mobile terminals, smart phones, or wearable devices) may provide various functions. For example, in addition to a basic voice communication function, a smart phone may provide various functions such as a short-range wireless communication (e.g., Bluetooth, Wi-Fi, or near field communication (NFC)) function, a mobile communication (3rd generation (3G), 4G, 5G, etc.) function, a music or video playback function, a photographing function, or a navigation function.

The electronic devices may include a rechargeable battery for portability. The electronic device may generally include a lithium-ion battery.

SUMMARY

However, the lithium-ion battery has a risk of explosion due to overcharge, internal short, or high temperature. Thus, an electronic device may provide a protection (e.g., explosion prevention) function of the battery using various technologies. For example, the electronic device may provide a function for protecting the battery through overcharge prevention, overdischarge prevention, and charge blocking according to a battery temperature. Alternatively, the electronic device determines whether the battery is abnormal (e.g., deteriorated or malfunctioned) by measuring a specific function based on power and a deterioration degree inputted in a section in which the battery has a specific state of capacity (SOC) or a voltage change of the battery in the section. However, the above-described methods are sensitive to an environment (e.g., temperature, current consumption difference for each event), and have a problem that accuracy quite falls.

Various embodiments of the present invention may quickly and accurately detect an abnormality of a battery.

In addition, various embodiments of the present invention may accurately provide information related to an abnormality of a battery.

An electronic device according to various embodiments of the present invention may include, for example, a battery; and a power management module operatively connected with the battery, and including a charging circuit which controls charge of the battery, wherein the power management module is configured to monitor a charge state of the battery, if the battery reaches a first designated state, identify a time taken to change from the first designated state to a second designated state, and determine whether the battery is abnormal, based at least in part on the identified time.

A method for diagnosing a battery of an electronic device according to various embodiments of the present invention may include, for example, monitoring a charge state of the battery; if the battery reaches a first designated state, identifying a time taken to change from the first designated state to a second designated state; and determining whether the battery is abnormal, based at least in part on the identified time.

An electronic device according to various embodiments of the present invention may include, for example, a battery; a charging module operatively connected with the battery, and configured to control a charge of the battery; and a processor operatively connected with the charging module, wherein the processor is configured to monitor a charge state of the battery, if the charge state of the battery reaches a first designated state, identify a time taken to change from the first designated state to a second designated state, and determine whether the battery is abnormal, based at least in part on the identified time.

An electronic device according to various embodiments of the present invention may quickly and accurately detect an abnormality of a battery. In addition, the electronic device may control charge of the battery (e.g., cut off or limit a charge amount) if detecting the abnormality of the battery, and thus prevent an accident (e.g., explosion, fire) due to the battery. In addition, the electronic device may notify a user of the battery abnormality, and guide replacement of the battery.

DETAILED DESCRIPTION

Figure 1:
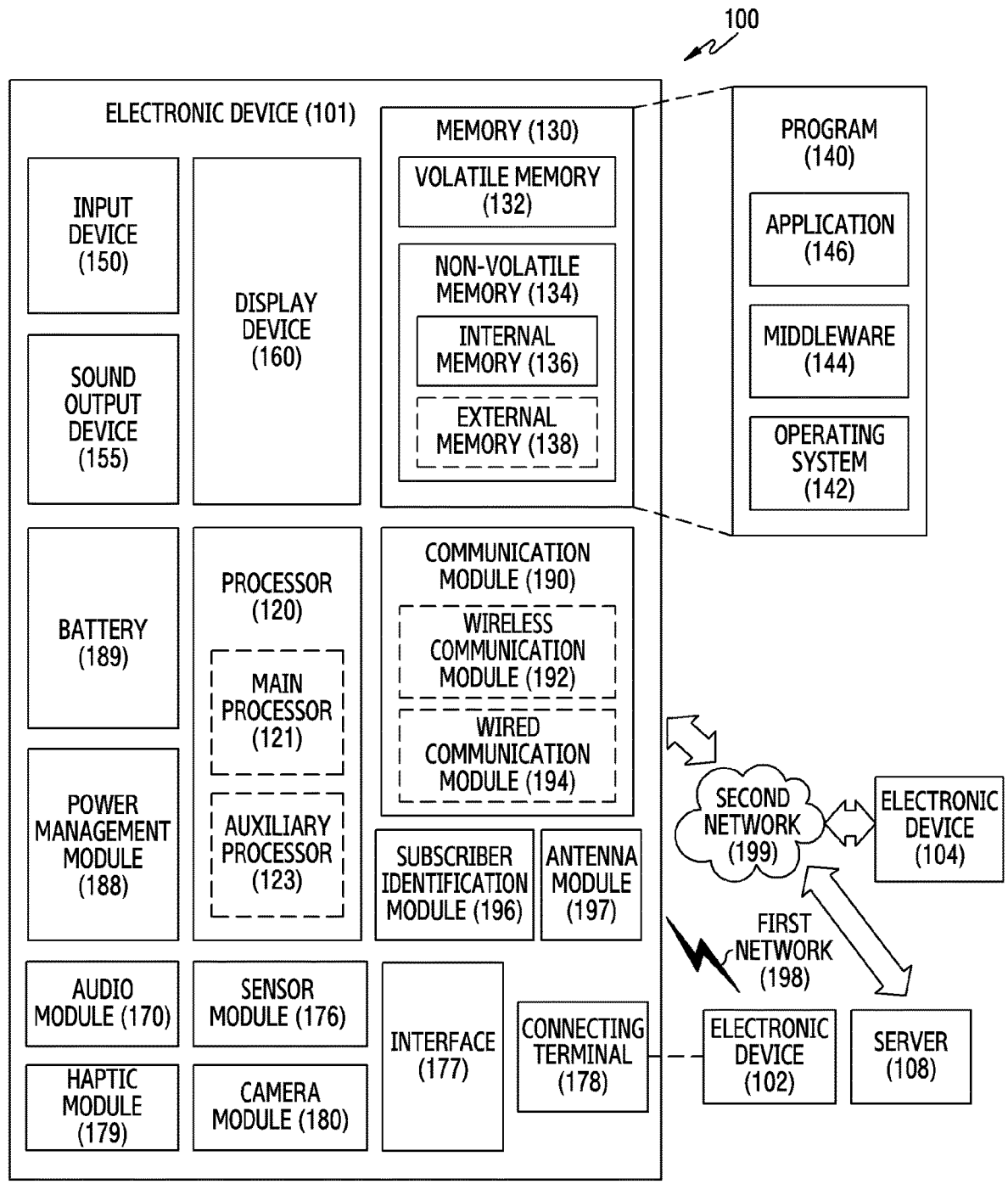
FIG. 1 is a block diagram of an electronic device in a network environment, according to various embodiments of the present invention.

Hereinafter, various embodiments of the present invention will be described with reference to the accompanying drawings. Although the present document discloses specific embodiments in the drawings and their related details, it is not intended to limit various embodiments of the present invention to specific forms. For example, it is apparent to those skilled in the art to which the present invention pertains that the embodiments of the present invention may be changed variously.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module(SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
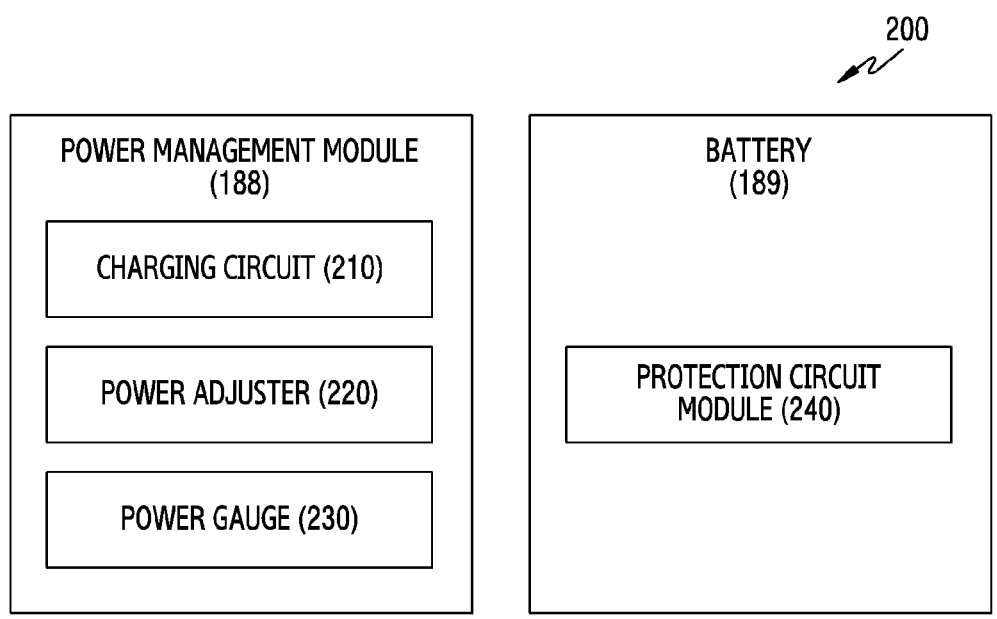
FIG. 2 is a block diagram of a power management module and battery, according to various embodiments of the present invention.

FIG. 2 is a block diagram 200 illustrating the power management module 188 and the battery 189 according to various embodiments of the present invention.

Referring to FIG. 2, the power management module 188 may include charging circuitry 210, a power adjuster 220, or a power gauge 230.

The charging circuitry 210 may charge the battery 189 by using power supplied from an external power source outside the electronic device 101. According to an embodiment, the charging circuitry 210 may select a charging scheme (e.g., normal charging or quick charging) based at least in part on a type of the external power source (e.g., a power outlet, a USB, or wireless charging), magnitude of power suppliable from the external power source (e.g., about 20 Watt or more), or an attribute of the battery 189, and may charge the battery 189 using the selected charging scheme. The external power source may be connected with the electronic device 101, for example, directly via the connecting terminal 178 or wirelessly via the antenna module 197.

The power adjuster 220 may generate a plurality of powers having different voltage levels or different current levels by adjusting a voltage level or a current level of the power supplied from the external power source or the battery 189. The power adjuster 220 may adjust the voltage level or the current level of the power supplied from the external power source or the battery 189 into a different voltage level or current level appropriate for each of some of the components included in the electronic device 101. According to an embodiment, the power adjuster 220 may be implemented in the form of a low drop out (LDO) regulator or a switching regulator.

The power gauge 230 may measure use state information about the battery 189 (e.g., a capacity, a number of times of charging or discharging, a voltage, or a temperature of the battery 189).

The power management module 188 may determine, using, for example, the charging circuitry 210, the power adjuster 220, or the power gauge 230, charging state information (e.g., lifetime, over voltage, low voltage, over current, over charge, over discharge, overheat, short, or swelling) related to the charging of the battery 189 based at least in part on the measured use state information about the battery 189. The power management module 188 may determine whether the state of the battery 189 is normal or abnormal based at least in part on the determined charging state information. If the state of the battery 189 is determined to abnormal, the power management module 188 may adjust the charging of the battery 189 (e.g., reduce the charging current or voltage, or stop the charging). According to an embodiment, at least some of the functions of the power management module 188 may be performed by an external control device (e.g., the processor 120).

The battery 189, according to an embodiment, may include a protection circuit module (PCM) 240. The PCM 240 may perform one or more of various functions (e.g., a pre-cutoff function) to prevent a performance deterioration of, or a damage to, the battery 189. The PCM 240, additionally or alternatively, may be configured as at least part of a battery management system (BMS) capable of performing various functions including cell balancing, measurement of battery capacity, count of a number of charging or discharging, measurement of temperature, or measurement of voltage.

According to an embodiment, at least part of the charging state information or use state information regarding the battery 189 may be measured using a corresponding sensor (e.g., a temperature sensor) of the sensor module 176, the power gauge 230, or the power management module 188. According to an embodiment, the corresponding sensor (e.g., a temperature sensor) of the sensor module 176 may be included as part of the PCM 240, or may be disposed near the battery 189 as a separate device.

The electronic device according to an embodiment of the present invention may determine whether the battery is abnormal (or diagnose the battery), based on the state of charge of the battery. For example, the electronic device may determine that the battery is abnormal if a time taken for the battery to change from a specific state (a first designated state) (e.g., a full voltage or a designated voltage) to another state (a second designated state) is different from a reference time (e.g., a taken time if the battery is normal). In addition, to prevent (or minimize) an incorrect measurement (an error) caused by an external factor, the electronic device may determine whether the battery is abnormal based on the charge state of the battery in a designated environment (or a designated condition) (e.g., a designated temperature, a designated time or an interactive state).

Determining whether the battery is abnormal may be performed by the power management module 188 including a charging circuit. According to some example, if the power management module 188 does not include the charging circuit, determining whether the battery is abnormal may be performed by a separate charging module. According to another example, determining whether the battery is abnormal may be conducted by the processor 120. According to yet another example, determining whether the battery is abnormal may be performed by the auxiliary processor 123 which operates in the inactive state of the electronic device, and is driven with low power. Hereafter, for convenience of descriptions, it is performed by the power management module 188 will be described as an example.

According to various embodiments of the present invention, an electronic device (e.g., the electronic device 101) may comprise: a battery (e.g., the battery 189); and a power management module (e.g., the power management module 188) operatively connected with the battery, and comprising a charging circuit (e.g., the charging circuit 210) which controls charge of the battery. The power management module may be configured to monitor a charge state of the battery, identify, if the battery reaches a first designated state, a time taken to change from the first designated state to a second designated state, and determine whether the battery is abnormal, based at least in part on the identified time.

According to various embodiments, the first designated state may be a state having a first voltage that causes the electronic device to display, on a user interface, that the battery is fully charged. The second designated state may be a state in which the charge of the battery is finished. The power management module may be configured to perform additional charge in the first designated state, and determine that the battery has abnormality when the time taken to change to the second designated state by the additional charge is greater than a first reference time designated.

According to various embodiments, the first designated state may be a state in which the charge of the battery is finished. The second designated state may be a state having a second voltage for starting a supplementary charge of the battery. The power management module may be configured to perform random discharge with a designated current amount in the first designated state, and determine that the battery has abnormality when the time taken to change to the second designated state by the random discharge is smaller than a second reference time designated.

According to various embodiments, the first designated state may be a state having a second voltage for starting a supplementary charge of the battery. The second designated state may be a state having a first voltage that causes the electronic device to display, on a user interface, that the battery is fully charged. The power management module may be configured to perform the supplementary charge in the first designated state, and determine that the battery has abnormality when the time taken to change to the second designated state by the supplementary charge is greater than a third reference time designated.

According to various embodiments, the power management module may be configured to further identify, in response to the battery reaching the first designated state, whether the electronic device is in a designated environment, and in response to the electronic device being in the designated environment, identify the time taken to change from the first designated state to the second designated state.

According to various embodiments, the designated environment may comprise at least one of a temperature of a designated range, a designated time or an inactive state.

According to various embodiments, the electronic device may further comprise a processor (e.g., the processor 120) configured to notify, in response to receiving information notifying the battery abnormality from the power management module, to a user using at least one of an audio output device (e.g., the audio output device 155), a haptic module (e.g., the haptic module 179), or a display (e.g., the display device 160).

According to various embodiments, the power management module may be configured to perform, in response to determining that the battery is abnormal, at least one of blocking the charge of the battery or limiting a full voltage by controlling the charging circuit.

According to various embodiments, the electronic device may further comprise a memory (e.g., the memory 130) for storing a result of determining whether the battery is abnormal. The power management module may be configured to determine whether the battery is abnormal, by considering determination results stored in the memory for a designated period.

According to various embodiments of the present invention, an electronic device (e.g., the electronic device 101) may comprise: a battery (e.g., the battery 189); a charging module (e.g., the charging circuit 210) operatively connected with the battery, and configured to control charge of the battery; and a processor (e.g., the processor 120) operatively connected with the charging module. The processor may be configured to monitor a charge state of the battery, identify, if the charge state of the battery reaches a first designated state, a time taken to change from the first designated state to a second designated state, and determine whether the battery is abnormal, based at least in part on the identified time.

According to various embodiments, the processor may be configured to further identify, in response to the battery reaching the first designated state, whether the electronic device is in a designated environment, and in response to the electronic device being in the designated environment, identify the time taken to change from the first designated state to the second designated state.

According to various embodiments, the designated environment may comprise at least one of a temperature of a designated range, a designated time or an inactive state.

According to various embodiments, the processor may be configured to perform, in response to determining that the battery is abnormal, at least one of blocking the charge of the battery or limiting a full voltage by controlling the charging module.

Figure 3:
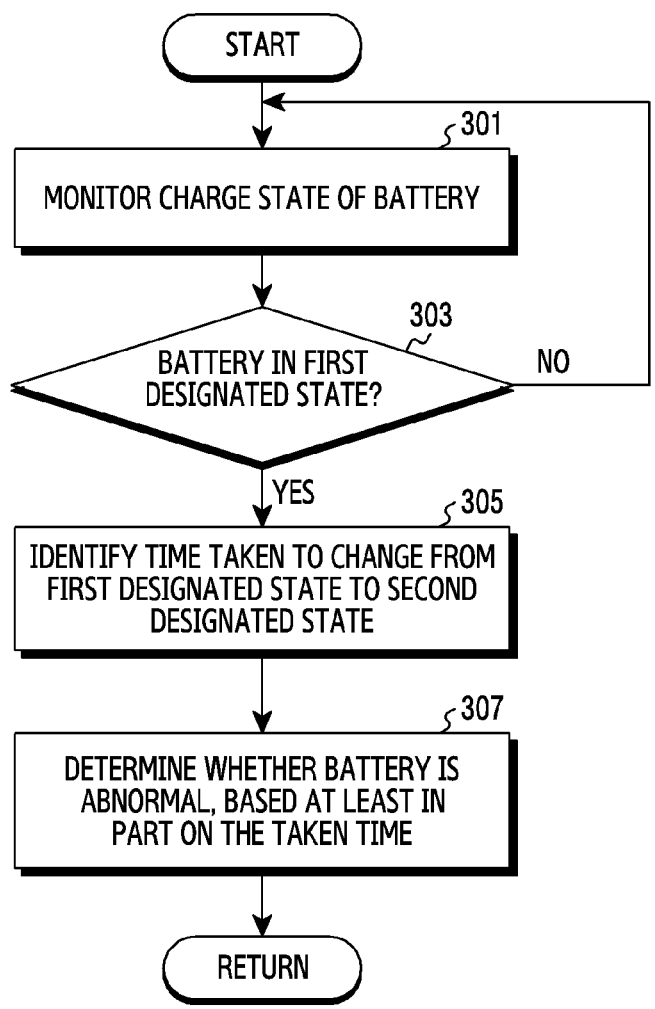
FIG. 3 is a flowchart illustrating a method of diagnosing a battery of an electronic device according to various embodiments of the present invention.
Figure 4:
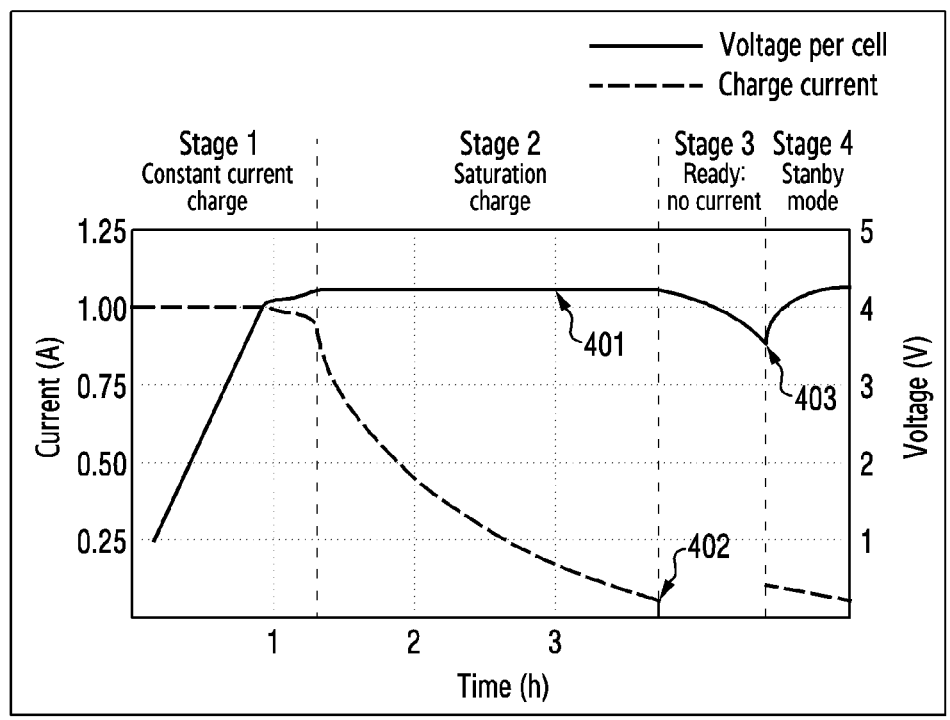
FIG. 4 is a diagram showing a state of charge of a battery according to various embodiments of the present invention.

FIG. 3 is a flowchart illustrating a method of diagnosing a battery of an electronic device according to various embodiments of the present invention, and FIG. 4 is a diagram illustrating a state of charge of a battery according to various embodiments of the present invention.

Referring to FIG. 3 and FIG. 4, a power management module (e.g., the power management module 188) of the electronic device (e.g., the electronic device 101) according to various embodiments of the present invention may monitor the charge state of the battery (e.g., the battery 189), in operation 301.

As shown in FIG. 4, the charge state of the battery may include a first step of charging with a constant current, a second step of charging while gradually decreasing the charge current (hereafter, saturation charge), a third step of stopping the charge, and a fourth step of perform topping charge (or supplementary charge).

If reaching a designated voltage (hereafter, a first voltage) 401 (e.g., 4.35V), the electronic device may display that the battery is fully charged (e.g., 100%) on a user interface (UI). Next, the power management module may perform the saturation charge (hereafter, additional charge) for the battery until the charge current falls below a designated value (e.g., 3% of related current) 402. If the additional charge is completed, the power management module may end the charging of the battery, and if charging is finished, the battery may start discharge. The power management module may recharge (hereafter, supplementary charge) the battery, if a designated voltage (hereafter, a second voltage) 403 (e.g., 4.3 V) is caused by the discharge of the battery.

The power management module according to various embodiments of the present invention may identify whether the battery is in a first designated state, in operation 303. As a result of identifying the operation 303, if the battery is not in the first designated state, the power management module may return to operation 301.

By contrast, as the result of identifying the operation 303, if the battery is in the first designated state, the power management module may identify a time taken to change from the first designated state to a second designated state, in operation 305. For example, the power management module may identify at least one of a time taken for the battery to change from the fully charged state having the first voltage to a charge completed state in which the charge is ended, a time taken to change from the charge completed state to a state having the second voltage, or a time taken to change from the state having the second voltage to the fully charged state.

In operation 307, the power management module according to various embodiments of the present invention may determine whether the battery is abnormal, based at least in part on the taken time. For example, the power management module may determine abnormality in the battery if the time taken to change from the fully charged state to the charge completed state is greater than a first reference time designated (e.g., 15 minutes). Alternatively, the power management module may discharge (e.g., randomly discharge) the battery with a designated current amount (e.g., 100 mA), in the charge completed state, and determine abnormality in the battery if the time taken to change to the state having the second voltage which starts the supplementary charge is smaller than a designated second reference time (e.g., 90 minutes), in response to the random discharge. Alternatively, the power management module may determine abnormality in the battery if the time taken to change from the state having the second voltage which starts the supplementary charge to the fully charged state is greater than a designated third reference time (e.g., 20 minutes). Detailed descriptions thereof shall be described with reference to FIG. 5 through FIG. 10.

According to some embodiment, the power management module may monitor the charge state of the battery if the electronic device is in a designated environment. Detailed descriptions thereof will be described later with reference to FIG. 11 and FIG. 12.

Figure 5:
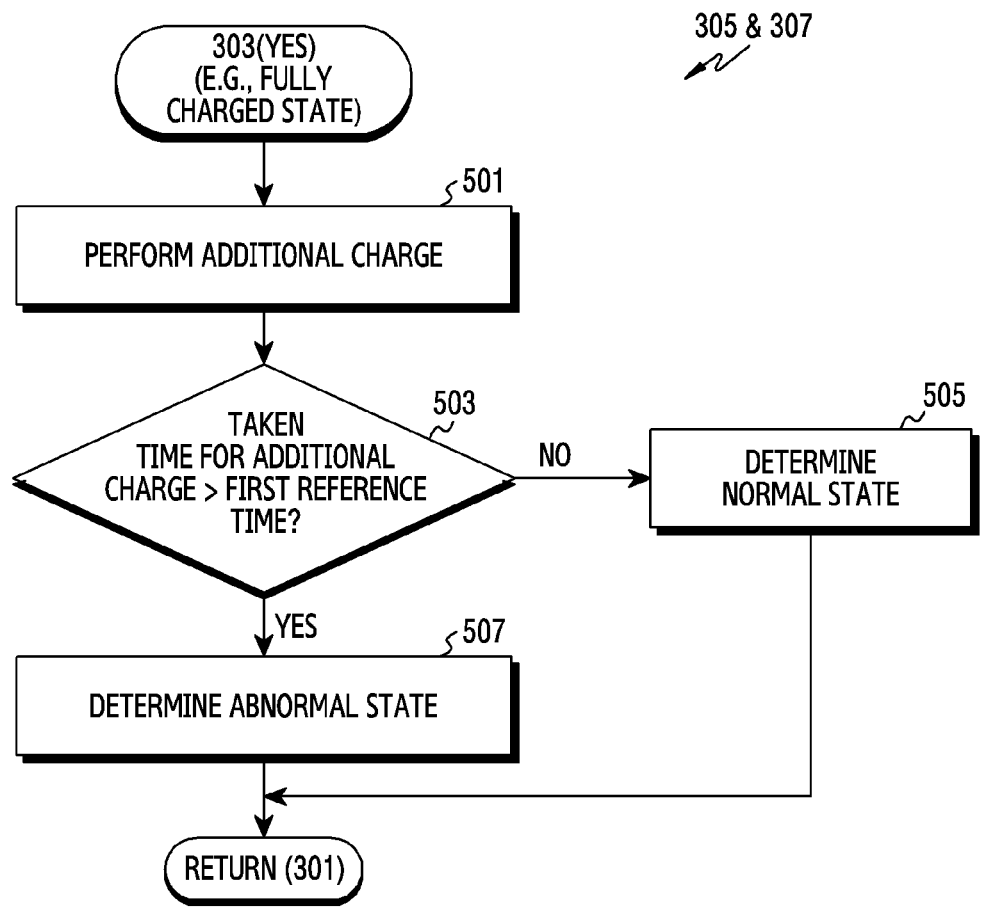
FIG. 5 is a flowchart illustrating a method of diagnosing a battery based on additional charge according to various embodiments of the present invention.
Figure 6:
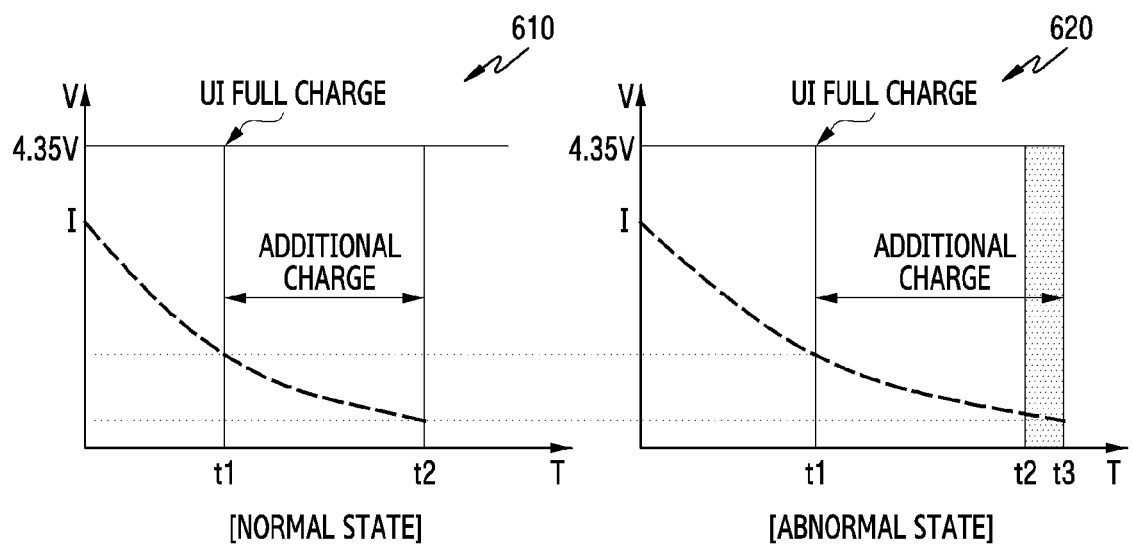
FIG. 6 is a graph illustrating an example of diagnosing a battery based on additional charge according to various embodiments of the present invention.

FIG. 5 is a flowchart illustrating a method of diagnosing a battery based on additional charge according to various embodiments of the present invention, and FIG. 6 is a graph illustrating an example of diagnosing a battery based on additional charge according to various embodiments of the present invention.

Referring to FIG. 5 and FIG. 6, a power management module (e.g., the power management module 188) of the electronic device (e.g., the electronic device 101) according to an embodiment of the present invention may perform the additional charge, in operation 501. For example, the power management module may perform the additional charge until the charge current decreases below a designated current value even though the battery has the first voltage (4.35V) indicated as the fully charged state. The designated current value may be 3% of the related current. For example, the designated current value may be 30 mA (=1000 mA*0.03) if the related current is 1 A, and may be 60 mA (2000 mA*0.03) for 2 A.

The power management module according to an embodiment of the present invention may identify whether a taken time for the additional charge is greater than a first reference time (e.g., 15 minutes), in operation 503. For example, the power management module may identify (check) the time taken until the charge of the battery is finished after starting the additional charge in the fully charged state, and identify whether the taken time is greater than the first reference time. As a result of identifying the operation 503, if the taken time for the additional charge is not greater than the first reference time, the power management module may determine that the battery is in the normal state, in operation 505. By contrast, as the result of identifying the operation 503, if the taken time for the additional charge is greater than the first reference time, the power management module may determine that the battery is in the abnormal state, in operation 507. For example, the battery of the normal state may, as shown in a drawing of an identification symbol 610 of FIG. 6, start the additional charge at a time t1, and complete the charge at a time t2. By contrast, the battery of the abnormal state may start the additional charge at the time t1, and complete the charge at a time t3 which is greater than t2, as shown in a drawing of an identification symbol 620 of FIG. 6. As such, the battery of the abnormal state has current leakage due to a fine short inside the cell, and the taken time for the additional charge may be increased by a difference of t3 and t2, due to the current leakage.

Diagnosis of the battery based on the taken time for the additional charge may be carried out if no external influence is exerted on the additional charge of the battery, or it is constant (e.g., the inactive state of the electronic device).

Figure 7:
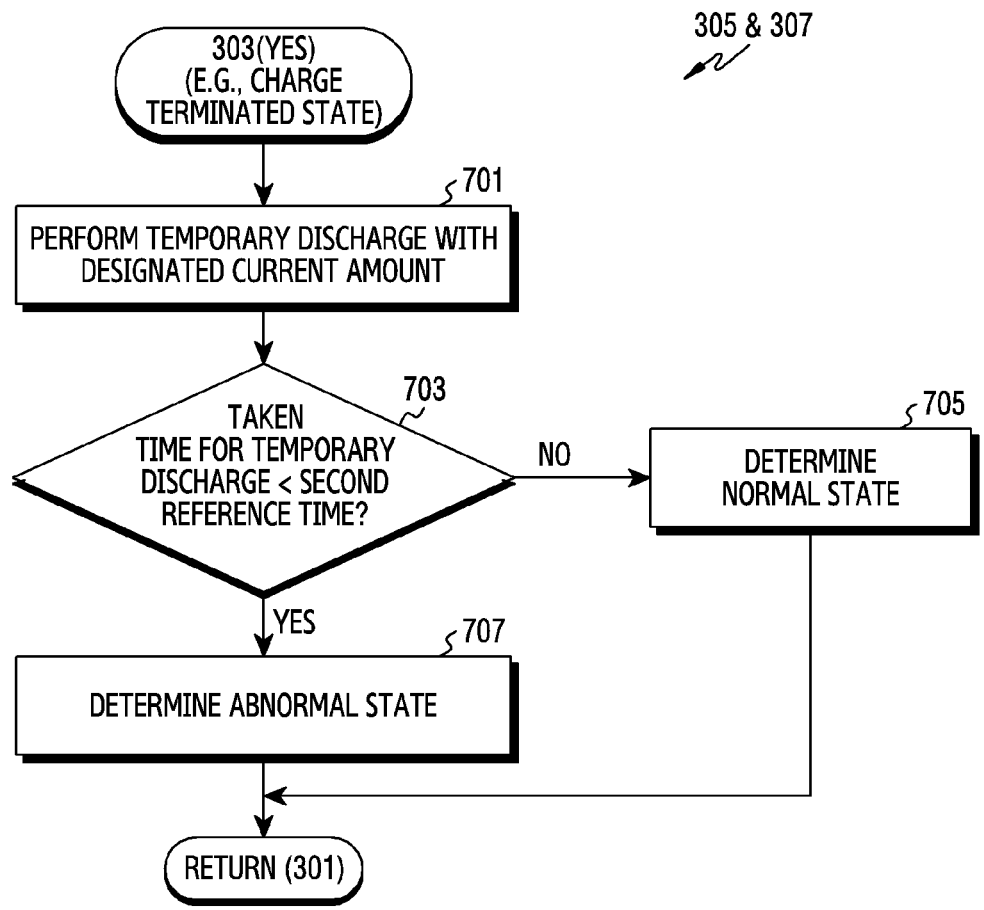
FIG. 7 is a flowchart illustrating a method of diagnosing a battery based on random discharge according to various embodiments of the present invention.
Figure 8:
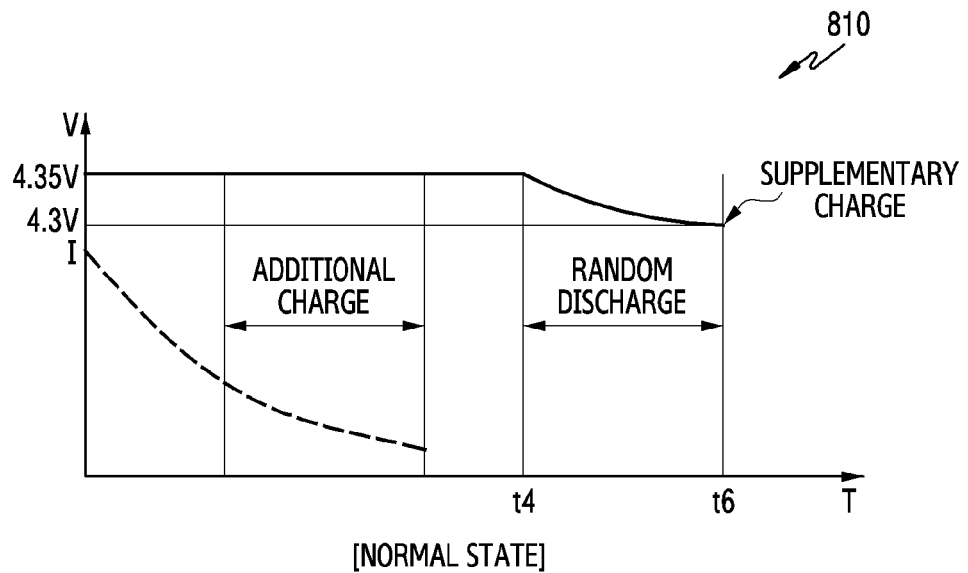
FIG. 8 is a graph illustrating an example of diagnosing a battery based on random discharge according to various embodiments of the present invention.
Figure 8:
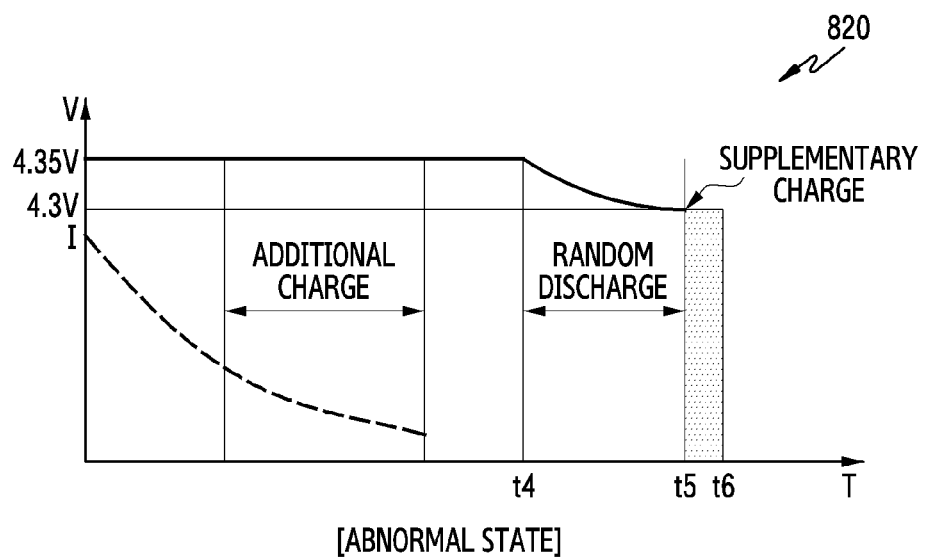

FIG. 7 is a flowchart illustrating a method of diagnosing a battery based on random discharge according to various embodiments of the present invention, and FIG. 8 is a graph illustrating an example of diagnosing a battery based on random discharge according to various embodiments of the present invention.

Referring to FIG. 7 and FIG. 8, a power management module (e.g., the power management module 188) of the electronic device (e.g., the electronic device 101) according to an embodiment of the present invention may perform temporary discharge (or random discharge) with a designated current amount, in operation 701. For example, after the battery charge is finished (completed), the power management module may perform the temporary discharge with a designated discharge current amount by conducting a designated function (or driving a designated component). The designated discharge current amount may be set in a range in which the discharge of the battery hardly affects a lifetime of the electronic device.

The power management module according to an embodiment of the present invention may identify whether a taken time for the random discharge is smaller than a second reference time (e.g., 90 minutes), in operation 703. For example, the power management module may identify (check) the time taken for the battery voltage to reach a designated voltage (e.g., the second voltage for starting the supplementary charge) after starting the temporary discharge, and identify whether the taken time is smaller than the second reference time. As a result of identifying the operation 703, if the taken time for the random discharge is not smaller than the second reference time, the power management module may determine that the battery is in the normal state, in operation 705. By contrast, as the result of identifying the operation 703, if the taken time for the random discharge is smaller than the second reference time, the power management module may determine that the battery is in the abnormal state, in operation 707. For example, the battery of the normal state may start the random discharge at a time t4 having the full voltage (e.g., 4.35 V), and reach the supplementary charge voltage at a time t6 (e.g., 4.3V), as shown in a drawing of an identification symbol 810 of FIG. 8. However, the battery of the abnormal state may start the random discharge at the time t4 and reach the supplementary charge voltage at a time t5 which is smaller than t6, as shown in a drawing of an identification symbol 820 of FIG. 8. As such, the battery of the abnormal state may have the fast discharge rate by a time corresponding to a difference of t6 and t5, due to current leakage due to a fine short inside the cell.

Diagnosis of the battery based on the taken time for the random discharge may be carried out if the battery discharge is not affected by other external factor than the designated current amount, or influence of the external factor is constant (e.g., the inactive state). According to some example, the diagnosis of the battery based on the taken time for the random discharge may be conducted at a designated time (e.g., dawn).

Figure 9:
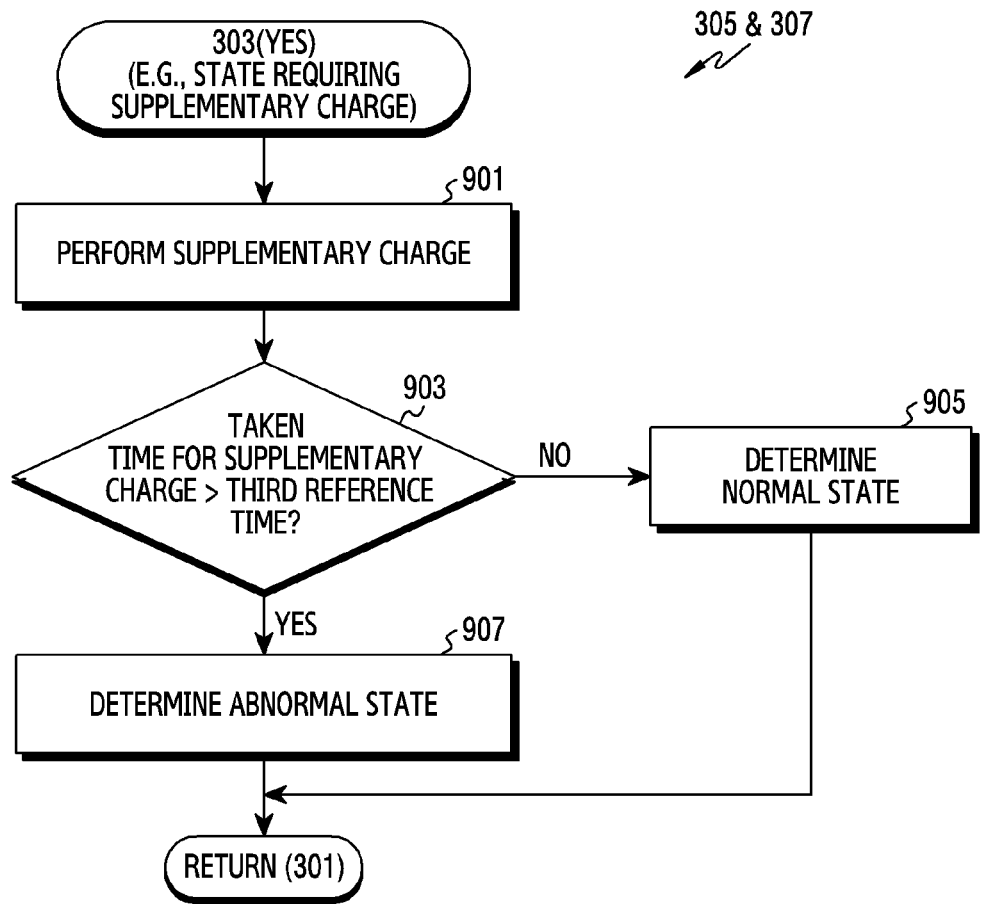
FIG. 9 is a flowchart illustrating a method of diagnosing a battery based on supplementary charge according to various embodiments of the present invention.
Figure 10:
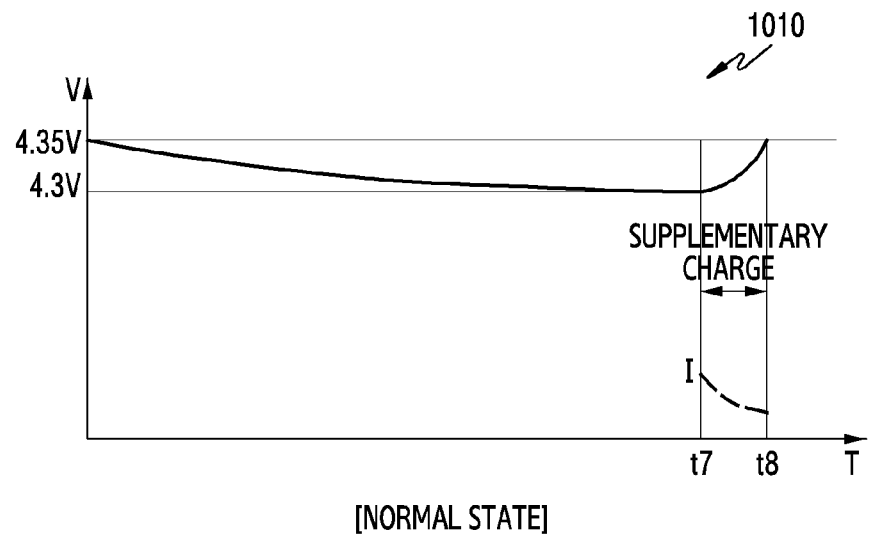
FIG. 10 is a graph illustrating an example of diagnosing a battery based on supplementary charge according to various embodiments of the present invention.
Figure 10:
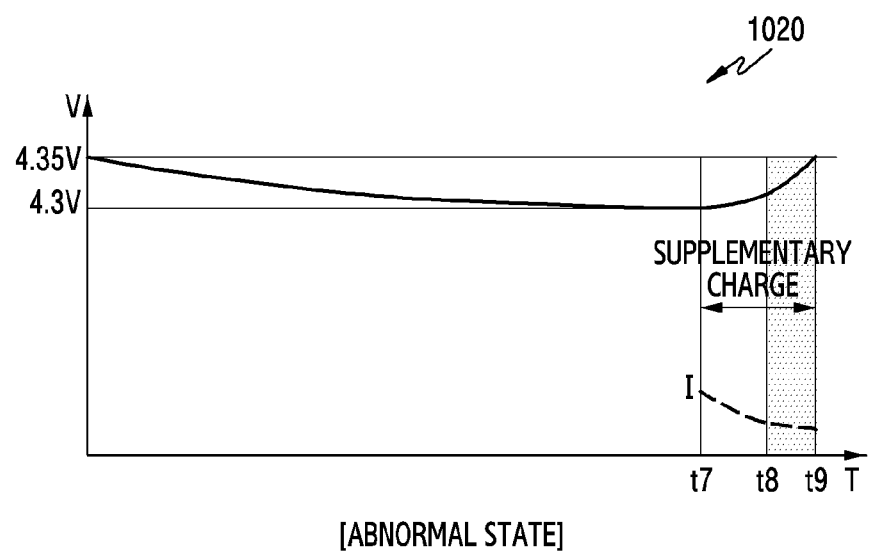

FIG. 9 is a flowchart illustrating a method of diagnosing a battery based on supplementary charge according to various embodiments of the present invention, and FIG. 10 is a graph illustrating an example of diagnosing a battery based on supplementary charge according to various embodiments of the present invention.

Referring to FIG. 9 and FIG. 10, a power management module (e.g., the power management module 188) of the electronic device (e.g., the electronic device 101) according to an embodiment of the present invention may perform the supplementary charge, in operation 901. For example, due to self-discharge (or function or application execution) after the charge completion of the battery (e.g., the battery 189), if the voltage of the battery reaches the supplementary charge voltage (e.g., 4.3V), the power management module may perform the supplementary charge.

The power management module according to an embodiment of the present invention may identify whether a taken time for the supplementary charge is greater than a third reference time (e.g., 20 minutes), in operation 903. For example, the power management module may identify (check) the taken time until the battery is fully charged after the start of the supplementary charge, and identify whether the taken time is greater than the third reference time. As a result of identifying the operation 903, if the taken time for the supplementary charge is not greater than the third reference time, the power management module may determine that the battery is in the normal state, in operation 905. By contrast, as the result of identifying the operation 903, if the taken time for the supplementary charge is greater than the third reference time, the power management module may determine that the battery is abnormal, in operation 907. For example, the battery of the normal state may start the supplementary charge at a time t7, and complete the supplementary charge at a time t8, as shown in a drawing of an identification symbol 1010 of FIG. 10. By contrast, the battery of the abnormal state may start the additional charge at the time t7, and complete the supplementary charge at a time t9 which is greater than t8, as shown in a drawing of an identification symbol 1020 of FIG. 10. As such, the battery of the abnormal state is subject to current leakage due to a fine short inside the cell, and due to the current leakage, the taken time for the supplementary charge may be increased by a difference of t9 and t8.

Diagnosis of the battery based on the taken time for the additional charge may be carried out if there is no external influence on the supplementary charge of the battery, or it is constant (e.g., the inactive state of the electronic device).

Meanwhile, it has been described that whether the battery is abnormal is determined based on any one of the taken time for the additional charge, the taken time for the random discharge or the taken time for the supplementary charge, with reference to FIG. 5 through FIG. 10. However, various embodiments of the present invention are not limited thereto, and the electronic device (the power management module) may determine whether the battery is abnormal by combining at least one of the taken time for the additional charge, the taken time for the random discharge or the taken time for the supplementary charge.

Figure 11:
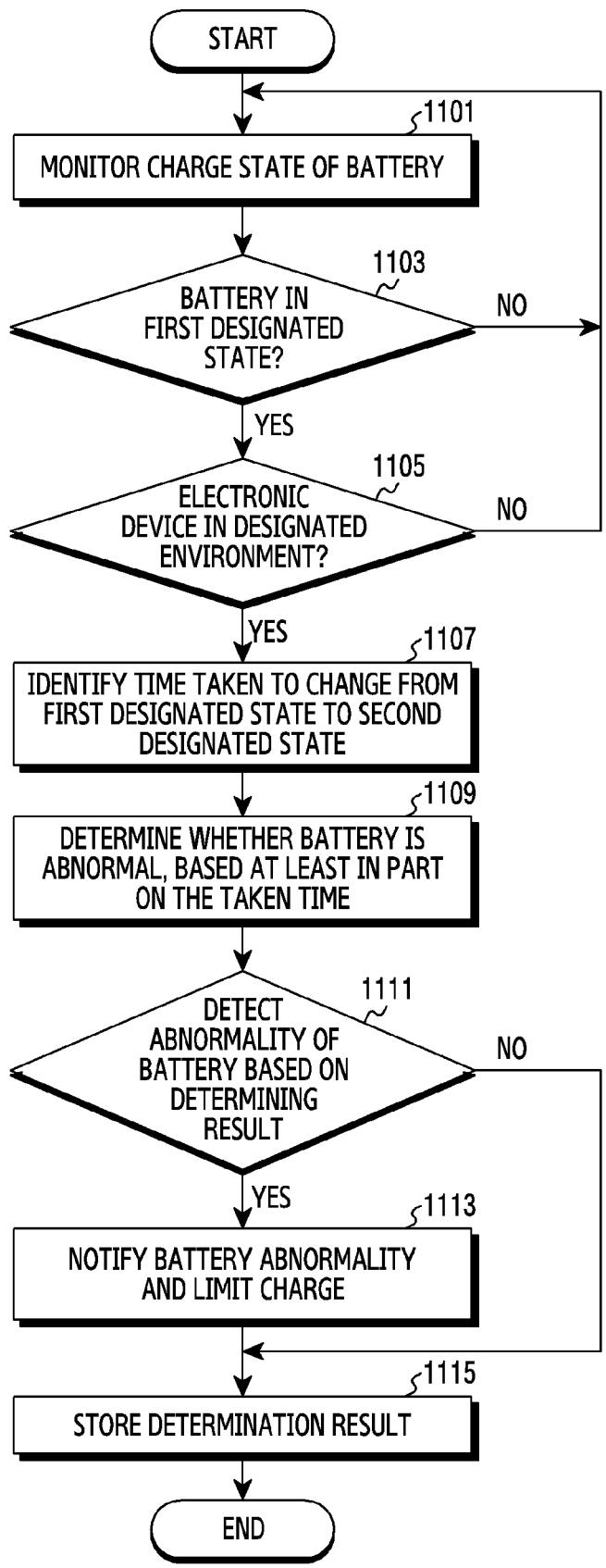
FIG. 11 is a flowchart illustrating a method of diagnosing a battery of an electronic device according to various embodiments of the present invention.

FIG. 11 is a flowchart illustrating a method of diagnosing a battery of an electronic device according to various embodiments of the present invention.

Referring to FIG. 11, a power management module (e.g., the power management module 188) of the electronic device (e.g., the electronic device 101) according to various embodiments of the present invention may monitor the charge state of the battery (e.g., the battery 189), in operation 1101.

The power management module according to various embodiments of the present invention may identify whether the battery is in the first designated state, in operation 1103. As a result of identifying the operation 1103, if the battery is not in the first designated state, the power management module may return to operation 1101.

By contrast, as the result of identifying the operation 1103, if the battery is in the first designated state, the power management module may identify whether the electronic device is the designated environment, in operation 1105. For example, the power management module may identify whether the charge or the discharge of the battery is not affected or constantly influenced (e.g., a situation where the processor is inactive, and has a temperature of a designated range) by an external factor (e.g., temperature, event occurrence, or application driving). Detailed descriptions thereof will be described later with reference to FIG. 12.

As a result of identifying the operation 1105, if the electronic device is not in the first designated environment, the power management module may return to the operation 1101. By contrast, as the result of identifying the operation 1105, if the electronic device is in the first designated environment, the power management module may identify a time taken to change from the first designated state to the second designated state, in operation 1107. In operation 1109, the power management module may determine whether the battery is abnormal, based at least in part on the taken time. The operation 1107 and the operation 1109 have been mentioned earlier with reference to FIG. 5 through FIG. 10, and thus detailed descriptions thereof shall be omitted.

The power management module according to various embodiments of the present invention may identify whether an abnormality of the battery is detected based on a determining result of operation 1109, in operation 1111. As a result of identifying the operation 1111, if the abnormality of the battery is not detected, the power management module may proceed to operation 1115 to be explained. By contrast, as the result of identifying the operation 1111, if abnormality of the battery is detected, the power management module may notify the abnormality of the battery, and limit the charge, in operation 1113. For example, the power management module may transmit information indicating the abnormality of the battery to a processor (e.g., the main processor 121). The processor receiving the information may notify the user of the battery abnormality by using at least one of an audio output device (e.g., the sound output device 155), a haptic module (e.g., the haptic module 179), or a display (e.g., the display device 160). In addition, the power management module may block the charge not to charge the battery, or may reduce the full voltage of the battery to a voltage (e.g., 3.8V) which is lower than the first voltage (e.g., 4.35V).

The power management module according to various embodiments of the present invention may store the determination result, in operation 1115. For example, the power management module may store the determination result in a memory (e.g., the memory 130). The determination result may be stored for a specific period (e.g., a month), or if all of the allocated storage space is used, the oldest determination result may be erased and stored.

According to some embodiment, the power management module may determine whether the battery is abnormal, by comprehensively considering (e.g., combining) the determination results stored for a specific period. Thus, an embodiment of the present invention may further improve accuracy of the battery diagnosis.

According to some embodiment, the power management module may store the determination result in the memory, and the processor may determine whether the battery is abnormal by comprehensively considering the determination results stored in the memory.

According to some embodiment, the operation 1105 may be performed before the operation 1101. For example, if the electronic device is in the designated environment, the power management module may monitor the charge state of the battery.

Figure 12:
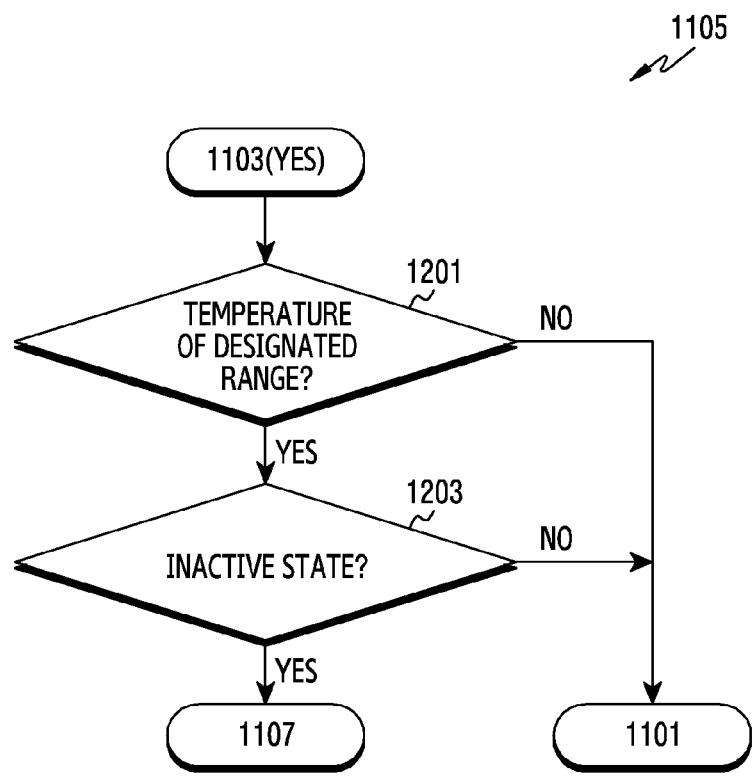
FIG. 12 is a flowchart illustrating a method of determining whether an electronic device is in a designated environment according to various embodiments of the present invention.

FIG. 12 is a flowchart illustrating a method of determining whether an electronic device is in a designated environment according to various embodiments of the present invention.

Referring to FIG. 12, a power management module (e.g., the power management module 188) of the electronic device (e.g., the electronic device 101) according to various embodiments of the present invention may identify whether a temperature is within a designated range, in operation 1201. For example, the power management module may measure the temperature of the battery (or around the battery) through a temperature sensor.

As a result of identifying the operation 1201, if the temperature is not within the designated range, the power management module may proceed to operation 1101 of FIG. 11 as described above. By contrast, as the result of identifying the operation 1201, if the temperature is within the designated range, the power management module may identify whether the electronic device (or the processor) is in the active state. As a result of identifying the operation 1203, if it is not in the inactive state, the power management module may proceed to operation 1101 of FIG. 11 as mentioned above. By contrast, as the result of identifying the operation 1203, in the inactive state, the power management module may proceed to operation 1107 of FIG. 11 described above.

According to some embodiment, the power management module may determine whether it is a designated time. The designated time may be set to a time for which the user does not use the electronic device (e.g., AM 2 through 5). Hence, it may prevent a problem that the user uses the electronic device during the diagnosis of the battery and the diagnosis of the battery is not completed. For example, the diagnosis of the battery through the random discharge may take a quite long time (e.g., 90 minutes), and accordingly it may be performed at the designated time. The designated time may be changed by the user.

According to various embodiments of the present invention, a method for diagnosing a battery (e.g., the battery 189) of an electronic device (e.g., the electronic device 101) may comprise monitoring a charge state of the battery; if the battery reaches a first designated state, identifying a time taken to change from the first designated state to a second designated state; and determining whether the battery is abnormal, based at least in part on the identified time.

According to various embodiments, the determining whether the battery is abnormal may be comprise at least one of: determining that the battery has abnormality when a time taken to change from a state having a first voltage that causes the electronic device to display, on a user interface, that the battery is fully charged to a state in which charge of the battery is finished(ended) by additional charge is greater than a first reference time designated; determining that the battery has abnormality when a time taken to change from the state in which the charge of the battery is finished to a state having a second voltage to start a supplementary charge of the battery by random discharge is smaller than a second reference time designated; or determining that the battery has abnormality when a time taken to change from the state having the second voltage to start the supplementary charge of the battery to the state having the first voltage that causes the electronic device to display, on a user interface, that the battery is fully charged by the supplementary charge is greater than a third reference time designated.

According to various embodiments, the method may further comprise: in response to the battery reaching the first designated state, identifying whether the electronic device is in a designated environment. The identifying the time taken to change from the first designated state to the second designated state is performed, in response to the electronic device being in the designated environment.

According to various embodiments, the designated environment may comprise at least one of a temperature of a designated range, a designated time or an inactive state.

According to various embodiments, the method may further comprise notifying a battery abnormality to a user using at least one of an audio output device, a haptic module, or a display.

According to various embodiments, the method may further comprise in response to determining that the battery is abnormal, performing at least one of blocking the charge of the battery or limiting a full voltage.

According to various embodiments, the method may further comprise: storing a result of determining whether the battery is abnormal in a memory; and determining whether the battery is abnormal, by considering determination results stored for a designated period.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the document, the electronic devices are not limited to those described above.

It should be appreciated that various embodiments of the present document and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor(e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the document may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
   a battery; and
   a power management module operatively connected with the battery, and comprising a charging circuit which controls charge of the battery,
   wherein the power management module is configured to:
   monitor a charge state of the battery,
   if the charge state of the battery reaches a first designated state, identify a time taken to change from the first designated state to a second designated state, and
   determine whether the battery is abnormal, based at least in part on the identified time,
   wherein the identified time includes a time taken to an additional charge, a time taken to a random discharge and a time taken to a supplementary charge,
   wherein the time taken to the additional charge indicates a time taken to change from a first state having a first voltage that causes the electronic device to display, on a user interface, that the battery is fully charged, to a second state in which the charge of the battery is finished,
   wherein the time taken to the random discharge indicates a time taken to change from the second state to a third state having a second voltage for starting a supplementary charge of the battery, and
   wherein the time taken to the supplementary charge indicates a time taken to change from the third state to the first state.

2. The electronic device of claim 1, wherein
   the power management module is configured to:
   determine that the battery has abnormality when the time taken to change to the additional charge is greater than a first reference time designated, the time taken to the random discharge is smaller than a second reference time designated, and the time taken to the supplementary charge is greater than a third reference time designated.

3. The electronic device of claim 1, wherein the power management module is configured to:
   in response to the battery reaching the first designated state, further identify whether the electronic device is in a designated environment, and
   in response to the electronic device being in the designated environment, identify the time taken to change from the first designated state to the second designated state.

4. The electronic device of claim 3, wherein the designated environment comprises at least one of a temperature of a designated range, a designated time or an inactive state of the electronic device.

5. The electronic device of claim 1, further comprising:
   a processor configured to notify a battery abnormality to a user using at least one of an audio output device, a haptic module, or a display, in response to receiving information notifying the battery abnormality from the power management module.

6. The electronic device of claim 1, wherein the power management module is configured to perform at least one of blocking the charge of the battery or limiting a full voltage by controlling the charging circuit in response to determining that the battery is abnormal.

7. The electronic device of claim 1, further comprising:
   a memory for storing a result of determining whether the battery is abnormal,
   wherein the power management module is configured to determine whether the battery is abnormal, by considering determination results stored in the memory for a designated period.

8. A method for diagnosing a battery of an electronic device, comprising:
   monitoring a charge state of the battery;
   if the charge state of the battery reaches a first designated state, identifying a time taken to change from the first designated state to a second designated state; and
   determining whether the battery is abnormal, based at least in part on the identified time,
   wherein the identified time includes a time taken to an additional charge, a time taken to a random discharge and a time taken to a supplementary charge,
   wherein the time taken to the additional charge indicates a time taken to change from a first state having a first voltage that causes the electronic device to display, on a user interface, that the battery is fully charged, to a second state in which the charge of the battery is finished,
   wherein the time taken to the random discharge indicates a time taken to change from the second state to a third state having a second voltage for starting a supplementary charge of the battery, and
   wherein the time taken to the supplementary charge indicates a time taken to change from the third state to the first state.

9. The method of claim 8, wherein determining whether the battery is abnormal comprises:
   determining that the battery has abnormality when the time taken to change to the additional charge is greater than a first reference time designated, the time taken to the random discharge is smaller than a second reference time designated, and the time taken to the supplementary charge is greater than a third reference time designated.

10. The method of claim 8, further comprising:
in response to the charge state of the battery reaching the first designated state, identifying whether the electronic device is in a designated environment; and
wherein the identifying the time taken to change from the first designated state to the second designated state is performed, in response to the electronic device being in the designated environment.

11. The method of claim 10, wherein the designated environment comprises at least one of a temperature of a designated range, a designated time or an inactive state of the electronic device.

12. The method of claim 8, further comprising:
notifying a battery abnormality to a user using at least one of an audio output device, a haptic module, or a display in response to determining that the battery is abnormal.

13. The method of claim 8, further comprising:
storing a result of determining whether the battery is abnormal in a memory; and
determining whether the battery is abnormal, by considering determination results stored in the memory for a designated period.

14. The method of claim 8, further comprising:
performing at least one of blocking the charge of the battery or limiting a full voltage in response to determining that the battery is abnormal.

15. An electronic device comprising:
a battery;
a charging module operatively connected with the battery, and configured to control a charge of the battery; and
a processor operatively connected with the charging module,
wherein the processor is configured to:
monitor a charge state of the battery,
identify, if the charge state of the battery reaches a first designated state, a time taken to change from the first designated state to a second designated state, and
determine whether the battery is abnormal, based at least in part on the identified time,
wherein the identified time includes a time taken to an additional charge, a time taken to a random discharge and a time taken to a supplementary charge,
wherein the time taken to the additional charge indicates a time taken to change from a first state having a first voltage that causes the electronic device to display, on a user interface, that the battery is fully charged, to a second state in which the charge of the battery is finished,
wherein the time taken to the random discharge indicates a time taken to change from the second state to a third state having a second voltage for starting a supplementary charge of the battery, and
wherein the time taken to the supplementary charge indicates a time taken to change from the third state to the first state.

16. The electronic device of claim 15, wherein the processor is configured to:
identify, in response to the battery reaching the first designated state, whether the electronic device is in a designated environment, and
in response to the electronic device being in the designated environment, identify the time taken to change from the first designated state to the second designated state.

17. The electronic device of claim 16, wherein the designated environment comprises at least one of a temperature of a designated range, a designated time or an inactive state of the electronic device.

18. The electronic device of claim 15, wherein the processor is configured to:
in response to determining that the battery is abnormal, perform at least one of blocking the charge of the battery or limiting a full voltage by controlling the charging module.

* * * * *